(12) United States Patent
Li et al.

(10) Patent No.: US 9,691,974 B2
(45) Date of Patent: Jun. 27, 2017

(54) PHASE-CHANGE DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Ying Li, Shanghai (CN); Yipeng Chan, Shanghai (CN); Lei Wang, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 15/187,293

(22) Filed: Jun. 20, 2016

(65) Prior Publication Data

US 2016/0308124 A1    Oct. 20, 2016

Related U.S. Application Data

(62) Division of application No. 14/614,099, filed on Feb. 4, 2015, now Pat. No. 9,419,054.

(30) Foreign Application Priority Data

May 15, 2014  (CN) .......................... 2014 1 0205887

(51) Int. Cl.
*H01L 45/00* (2006.01)
*H01L 21/306* (2006.01)
*H01L 27/24* (2006.01)

(52) U.S. Cl.
CPC ............ *H01L 45/06* (2013.01); *H01L 21/306* (2013.01); *H01L 27/2436* (2013.01);
(Continued)

(58) Field of Classification Search
CPC ... H01L 21/306; H01L 27/2436; H01L 45/06; H01L 45/144; H01L 45/1675; H01L 25/06; H01L 45/16; H01L 27/24; H01L 45/04
(Continued)

(56) References Cited

U.S. PATENT DOCUMENTS

2001/0050196 A1    12/2001  Okada
2008/0044632 A1*    2/2008  Liu ..................... H01L 27/2436
                                                         428/192
(Continued)

*Primary Examiner* — Jarrett Stark
*Assistant Examiner* — Shahed Ahmed
(74) *Attorney, Agent, or Firm* — Innovation Counsel LLP

(57) ABSTRACT

A method for manufacturing a phase-change device may include the following steps: preparing a substrate; preparing a first dielectric layer, which may be positioned on the substrate; preparing a first electrode, which may be positioned in the first dielectric layer; forming a phase-change material layer, which may overlap the first electrode; processing (e.g., etching) the phase-change material layer to form a phase-change member, which may be electrically connected to the first electrode; forming an etch-stop layer, which may overlap and/or cover the phase-change member; forming an intermediary layer, which may be positioned on the etch-stop layer; forming a second dielectric layer, which may be positioned on the intermediary layer; and forming a second electrode, which may extend through the second dielectric layer, the intermediary layer, and the etch-stop layer and may be electrically connected to the phase-change member.

8 Claims, 7 Drawing Sheets

(52) U.S. Cl.
CPC ............ *H01L 45/144* (2013.01); *H01L 45/16* (2013.01); *H01L 45/1675* (2013.01)

(58) Field of Classification Search
USPC ........ 257/225, 245, 248, 342; 438/261, 689, 438/629, 637, 672
See application file for complete search history.

(56) References Cited

U.S. PATENT DOCUMENTS

| | | | |
|---|---|---|---|
| 2008/0265238 A1 | 10/2008 | Chen | |
| 2012/0032136 A1* | 2/2012 | Redaelli | ............. H01L 27/2445 257/5 |
| 2012/0282132 A1* | 11/2012 | Watkins | ................. B82Y 30/00 420/416 |
| 2013/0126817 A1 | 5/2013 | Joshi | |

* cited by examiner

PHASE-CHANGE DEVICE, RELATED MANUFACTURING METHOD, AND RELATED ELECTRONIC DEVICE

CROSS-REFERENCE TO RELATED APPLICATION

This is a divisional application of U.S. patent application Ser. No. 14/614,099 filed on Feb. 4, 2015, which application claims priority to and benefit of Chinese Patent Application No. 201410205887.8, filed on 15 May 2014, the disclosure of each application is incorporated herein by reference in their entirety.

BACKGROUND OF THE INVENTION

The present invention is related to a phase-change device, a method for manufacturing the phase-change device, and an electronic device that includes the phase-change device.

A phase-change device may include a phase-change member, which may be formed of a phase-change material, for performing one or more particular functions. For example, a phase-change memory device may include a phase-change member for performing functions related to data storage.

In a process for manufacturing a phase-change memory device, an inter-metal dielectric (IMD) layer may be directly formed on a phase-change material layer that is used for forming a phase-change member. Typically, the IMD layer may be formed of fluorosilicate glass (FSG), and the phase-change material layer may be formed of germanium-antimony-tellurium ($Ge_2Sb_2Te_5$ or GST). Because of material properties, FSG and GST may not sufficiently securely adhere to each other. Therefore, in the process for manufacturing for the phase-change memory device, the IMD layer may be undesirably detached from the phase-change member, and the phase-change member may be undesirably etched when the IMD layer is etched. As a result, the quality of the phase-change memory device may be unsatisfactory, and the yield associated with the manufacturing process may be undesirably low.

SUMMARY

An embodiment of the present invention may be related to a method for manufacturing a phase-change device. The method may include the following steps: preparing a substrate; preparing a first dielectric layer, which may be positioned on the substrate; preparing a first electrode, which may be positioned in the first dielectric layer; forming a phase-change material layer, which may overlap the first electrode; processing (e.g., etching) the phase-change material layer to form a phase-change member, which may be electrically connected to the first electrode; forming an etch-stop layer, which may overlap and/or cover the phase-change member; forming an intermediary layer, which may be positioned on the etch-stop layer; forming a second dielectric layer, which may be positioned on the intermediary layer; and forming a second electrode, which may extend through the second dielectric layer, the intermediary layer, and the etch-stop layer and may be electrically connected to the phase-change member.

The substrate may be a front-end-of-line (FEOL) member that may include one or more of a semiconductor substrate, a transistor, a metal layer, an electronic component, an interconnect structure, etc.

The etch-stop layer may be formed of silicon nitride. The intermediary layer may be formed of a silicon-rich oxide material. The second dielectric layer may be formed of at least one of an undoped silicate glass material and a fluorine-doped silica glass material.

The etch-stop layer may directly contact two opposite sides of the phase-change member.

A portion of the etch-stop layer may overlap a top side of the phase-change member in a direction perpendicular to a bottom surface of the substrate. The portion of the etch-stop layer may be spaced from the phase-change member, e.g., separated from the phase-change member by a protective layer. The second electrode may be formed after the portion of the etch-stop layer has been removed.

The method may include the following steps: forming a protective material layer on the phase-change material layer; processing (e.g., etching) the protective material layer to form a protective layer, wherein the protective layer may directly contact the phase-change member. The protective material layer and the phase-change material layer may be etched in a same process step using a same etchant. The protective layer may be formed of titanium nitride.

The etch-stop layer may directly contact two opposite sides of the protective layer. A portion of the etch-stop layer may directly contact a top side of the protective layer. The second electrode may be formed after the portion of the etch-stop layer has been removed.

An etching process may be performed to form a first hole through the second dielectric layer and the intermediary layer. A subsequent etching process may be performed to form a second hole through the etch-stop layer. The second electrode may be formed in a combination of the first hole and the second hole.

An embodiment of the invention may be related to a phase-change device. The phase-change device may include the following elements: a substrate; a first dielectric layer, which may be positioned on the substrate; a first electrode, which may be positioned in the first dielectric layer; a second dielectric layer, which may overlap the first dielectric layer; a second electrode, wherein a portion of the second electrode may be positioned in the second dielectric layer; a phase-change member electrically connected to each of the first electrode and the second electrode; an etch-stop layer positioned between the phase-change member and the second dielectric layer; and an intermediary layer positioned between the etch-stop layer and the second dielectric layer.

The second electrode may extend through the intermediary layer and the etch-stop layer. The intermediary layer may be formed of a silicon-rich oxide material. The etch-stop layer may directly contact two opposite sides of the phase-change member.

Two top portions of the etch-stop layer may directly contact two opposite sides of the second electrode. The two top portions of the etch-stop layer may overlap a top side of the phase-change member in a direction perpendicular to a bottom surface of the substrate.

The etch-stop layer may directly contact each of the second electrode, the intermediary layer, and the phase-change member.

A first portion of the etch-stop layer may be positioned between the phase-change member and a first portion of the intermediary layer in a direction perpendicular to a bottom surface of the substrate. A second portion of the etch-stop layer may be positioned between the phase-change member and a second portion of the intermediary layer in a direction parallel to a bottom surface of the substrate The phase-change device may include a protective layer that may be positioned between the etch-stop layer and the phase-change member and may be positioned between the second electrode and the phase-change member.

The protective layer may directly contact each of the second electrode, the phase-change member, and the etch-stop layer.

An embodiment of the present invention may be related to an electronic device. The electronic device may include an electronic component and a phase-change device electrically connected to the electronic component. The electronic device may have one or more of the features and advantages associated with the aforementioned method and phase-change device.

According to embodiments of the invention, in a process for manufacturing a phase-change device, an etch-stop layer may be provided to protect a phase-change member, and an intermediary layer may be provided to facilitate bonding between elements that overlap the phase-change member. Therefore, satisfactory quality of the phase-change member may be substantially maintained, and satisfactory bonding between elements in the phase-change device may be enabled. Advantageously, satisfactory quality of the phase-change device and a satisfactory yield of the manufacturing process may be substantially ensured.

The above summary is related to some of many embodiments of the invention disclosed herein and is not intended to limit the scope of the invention.

DETAILED DESCRIPTION

Figure 1A:
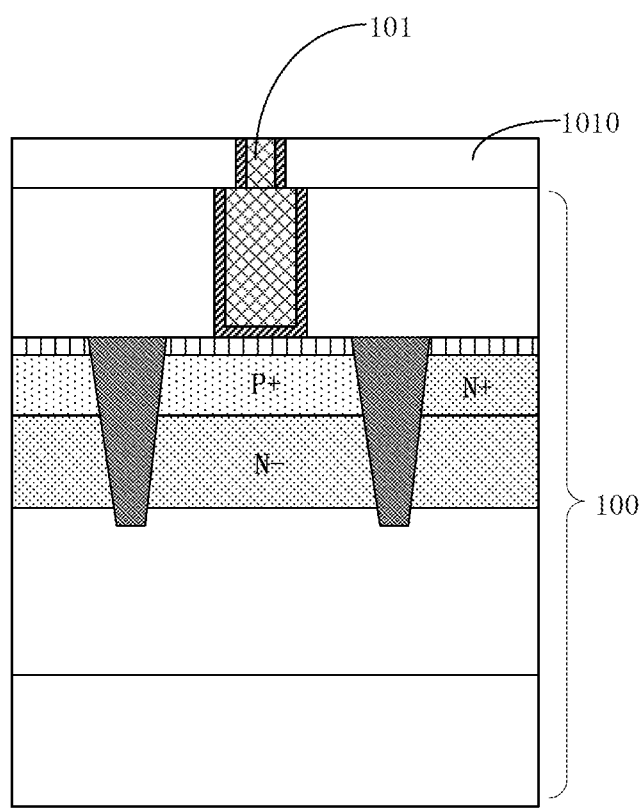
FIG. 1A, FIG. 1B, FIG. 1C, FIG. 1D, and FIG. 1E show schematic cross-sectional views that illustrate elements and/or structures formed in a method for manufacturing a phase-change device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1A, FIG. 1B, FIG. 1C, FIG. 1D, and FIG. 1E show schematic cross-sectional views that illustrate elements and/or structures formed in a method for manufacturing a phase-change device in accordance with one or more embodiments of the present invention. FIG. 2 shows a flowchart that illustrates a method for manufacturing the phase-change device in accordance with one or more embodiments of the present invention.

Referring to FIG. 2, the method may include steps S201, S202, S203, S204, and S205.

Figure 2:
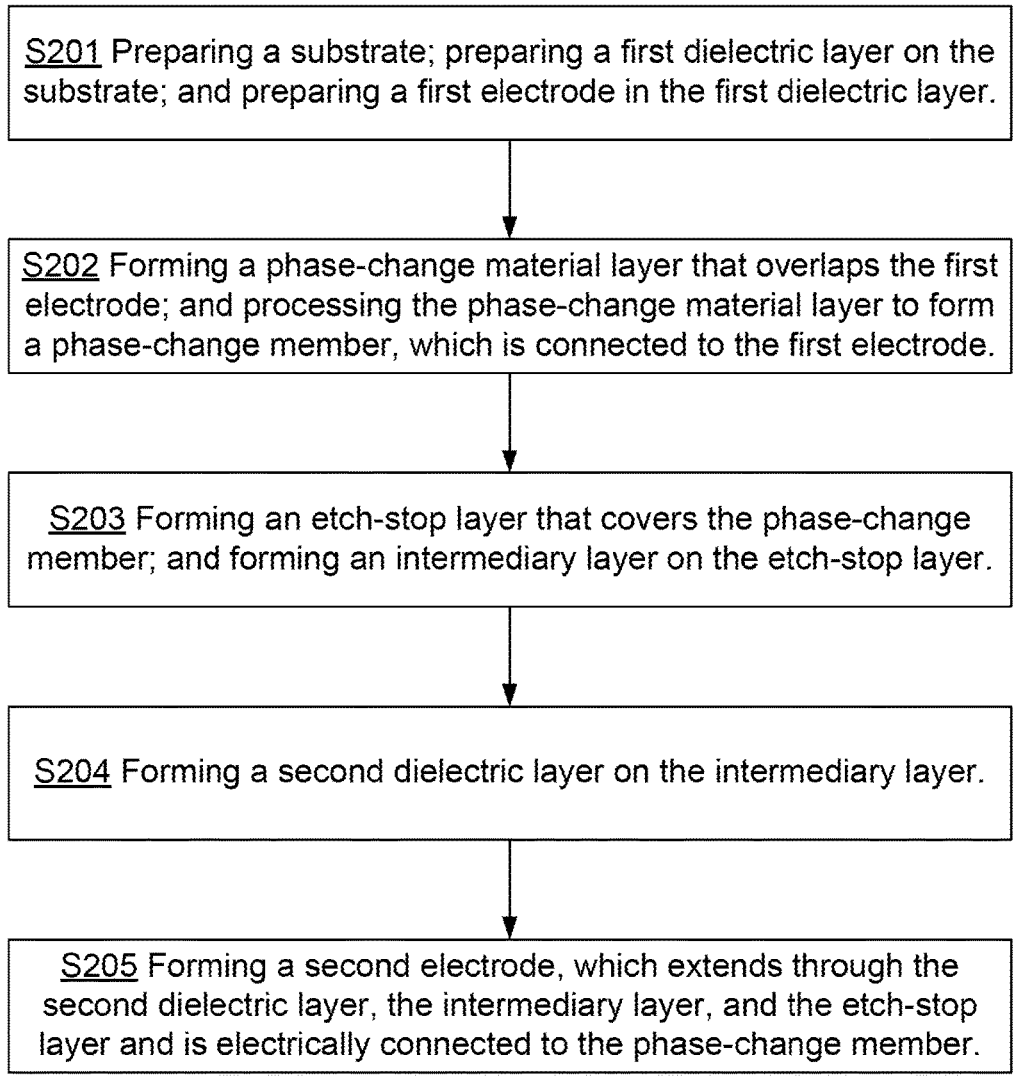
FIG. 2 shows a flowchart that illustrates a method for manufacturing a phase-change device in accordance with one or more embodiments of the present invention.

Referring to FIG. 2 and FIG. 1A, the step S201 may include the following sub-steps: preparing a substrate 100; preparing a first dielectric layer 1010, which may be positioned on the substrate 100; and preparing a first electrode 101, which may be positioned in the first dielectric layer 1010.

The substrate 100 may be a front-end-of-line (FEOL) member that may include one or more of a semiconductor substrate, a conductive member, a transistor, a metal layer, an electronic component, an interconnect structure, etc. The first electrode 101 may be electrically connected to one or more electronic components in the substrate 100 through a conductive member, which may be positioned in a contact hole.

The first dielectric layer 1010 may be formed of silicon oxide and/or one or more other suitable materials. The first electrode 101 may be formed of tungsten and/or one or more other suitable materials.

A process for forming the first electrode 101 may include the following steps: etching the first dielectric layer 1010 to form a hole; providing a conductive material, e.g., a metal material, in the hole for forming the first electrode 101; and performing a polishing process, e.g., a chemical-mechanical polishing (CMP) process to remove excess material and/or to planarize the top surface of the first electrode 101.

Figure 1B:
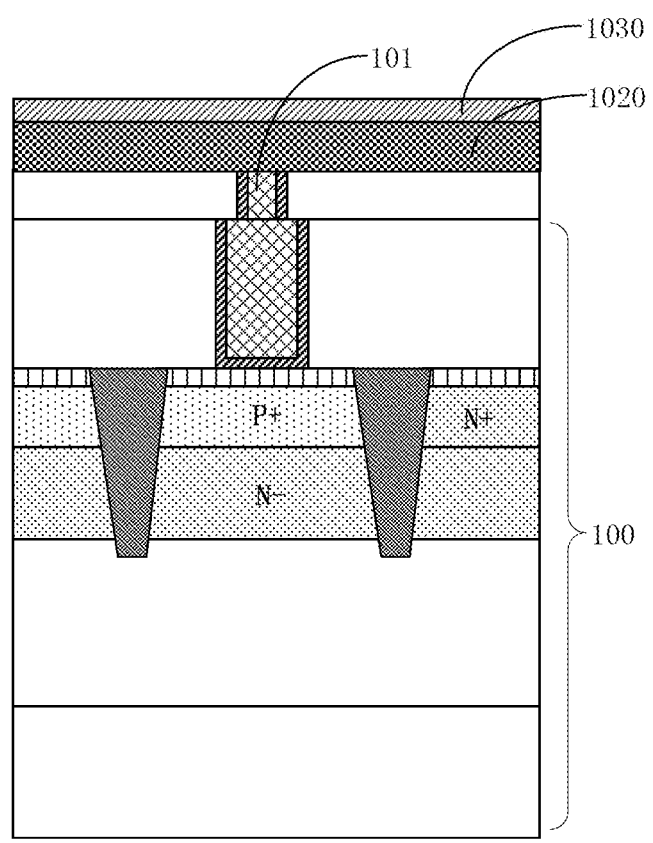
Figure 1C:
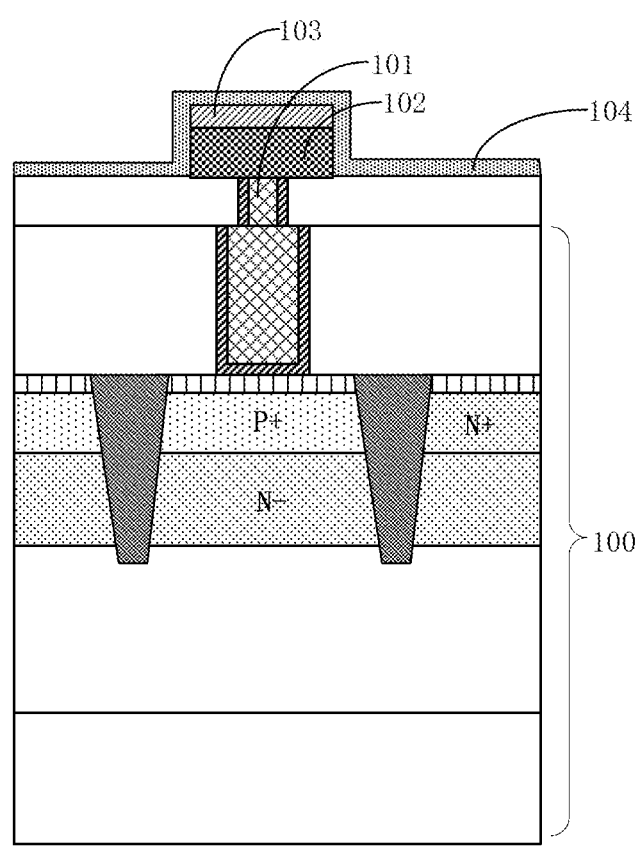

Referring to FIG. 2, FIG. 1A, and FIG. 1B, the step S202 may include the following sub-steps: forming a phase-change material layer 1020, which may overlap the first electrode 101; and processing (e.g., etching) the phase-change material layer 1020 to form a phase-change member 102. The phase-change member 102 may be electrically connected to the first electrode 101. The phase-change member 102 may be formed of GST and/or one or more other suitable materials.

The step S202 may also include the following sub-steps: forming a protective material layer 1030 on the phase-change material layer 1020; processing (e.g., etching) the protective material layer 1030 to form a protective layer 103. The protective layer 103 may directly contact the phase-change member 102. The protective material layer 1030 and the phase-change material layer 1020 may be processed (e.g., etched) in a same etching process using a same etchant, such that both the phase-change member 102 and the protective layer 103 may be formed as a result of the etching process. The protective layer 103 may be configured to protect the phase-change member 102. The protective layer 103 may be formed of a conductive material, such as titanium nitride and/or one or more other suitable conductive materials.

Referring to FIG. 2, FIG. 1B, FIG. 1C, and FIG. 1D, the step S203 may include the following sub-steps: forming an etch-stop layer 104, which may overlap and/or cover the phase-change member 102; and forming an intermediary layer 105, which may be positioned on the etch-stop layer 104.

Two opposite sections of the etch-stop layer 104 may directly contact two opposite sides of the phase-change member 102. The phase-change member 102 may be positioned between the two opposite sections of the etch-stop layer 104. A top section of the etch-stop layer 104 may overlap a top side of the phase-change member 102 in a direction perpendicular to a bottom surface of the substrate 100. The top section of the etch-stop layer 104 may be spaced from the phase-change member 102, e.g., separated from the phase-change member 102 by the protective layer 103.

The opposite sections of the etch-stop layer 104 may directly contact two opposite sides of the protective layer 103. The protective layer 103 may be positioned between the two opposite sections of the etch-stop layer 104. The top section of the etch-stop layer 104 may overlap (and directly contact) a top side of the protective layer 103 in the direction perpendicular to the bottom surface of the substrate 100.

Two opposite sections of the intermediary layer 105 may directly contact the two opposite sections of the etch-stop layer 104. The two opposite sections of the etch-stop layer 104 may be positioned between the two opposite sections of the intermediary layer 105. A top section of the intermediary layer 105 may overlap (and directly contact) the top section of the etch-stop layer 104 and may overlap the top side of the phase-change member 102 in the direction perpendicular to the bottom surface of the substrate 100.

The etch-stop layer 104 may be formed through a deposition process and/or one or more other suitable processes. The etch-stop layer 104 may be formed of silicon nitride and/or one or more other suitable materials. The etch-stop layer 104 may protect the phase-change member 102 from unintended etching and/or unwanted damage, e.g., in a process of etching the subsequently formed second dielectric layer 106 (illustrated in FIG. 1D).

The intermediary layer 105 may be formed through a deposition process and/or one or more other suitable processes. The intermediary layer 105 may be formed of a silicon-rich oxide material and/or one or more other suitable materials. The intermediate layer 105 may substantially securely adhere to the etch-stop layer 104. The intermediary layer 105 may enhance adhesion between the etch-stop layer 104 and the subsequently formed second dielectric layer 106 (illustrated in FIG. 1D), such that the second dielectric layer 106 may be substantially secured in the phase-change device.

The etch-stop layer 104 and the intermediary layer 105 may enable the phase-change device to have satisfactory quality and may enable the phase-change device manufacturing process to have a satisfactory yield.

Figure 1D:
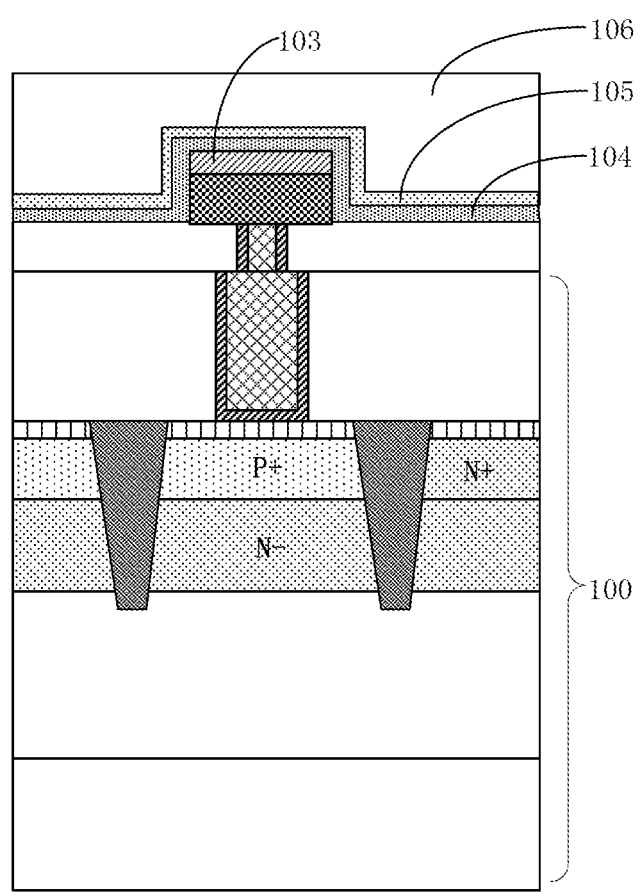

Referring to FIG. 2 and FIG. 1D, the step S204 may include forming a second dielectric layer 106, which may be positioned on the intermediary layer 105. The second dielectric layer 106 may be formed through a deposition process and/or one or more other suitable processes. The second dielectric layer 106 may be formed of at least one of an undoped silicate glass material and a fluorine-doped silica glass material. The second dielectric layer 106 may substantially securely adhere to the intermediary layer 105.

Figure 1E:
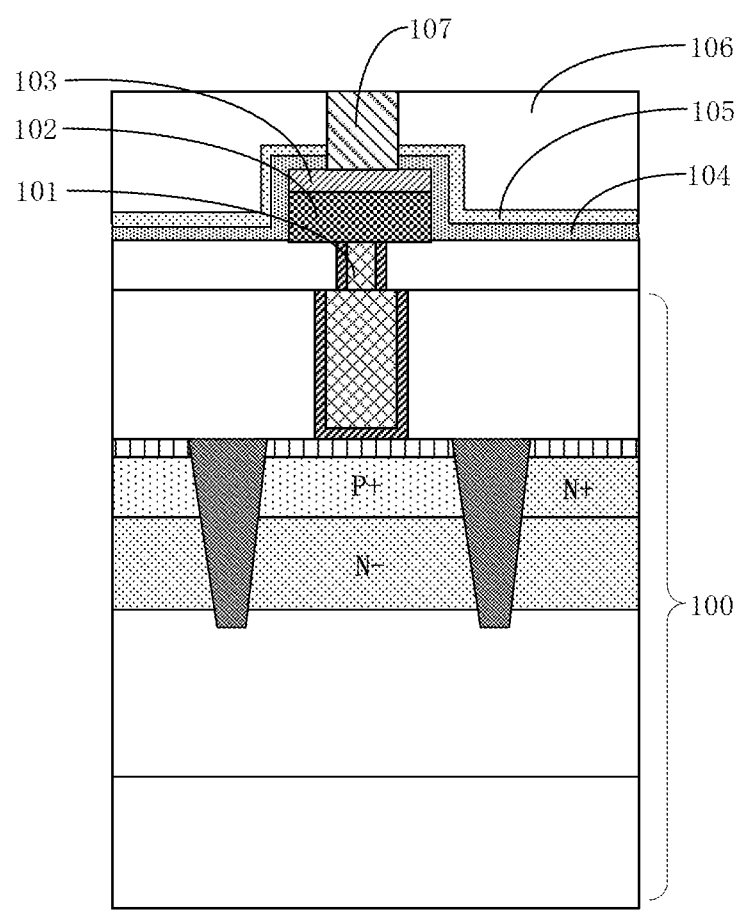

Referring to FIG. 2, FIG. 1D, and FIG. 1E, the step S205 may include forming a second electrode 107, which may extend through the second dielectric layer 106, the intermediary layer 105, and the etch-stop layer 104 and may be electrically connected to the phase-change member 102.

The step S205 may include performing an etching process to form a first hole through the second dielectric layer 106 and the intermediary layer 105. A portion of the top section of the intermediary layer 105 (which may overlap the top side of the phase-change member 102) may be removed in the etching process for forming the first through-hole.

The step S205 may further include performing a subsequent etching process to form a second hole through the etch-stop layer 104. A portion of the top section of the etch-stop layer 104 (which may overlap the top side of the phase-change member 102) may be removed in the etching process for forming the second through-hole. An etch rate for the etch-stop layer 104 may be substantially higher than an etch rate for the phase-change member 102 (and/or the protective layer 103) in the etching process for forming the second through-hole.

During the etching processes, the phase-change member 102 may be substantially protected by the etch-stop layer 104 (and the protective layer 103). Advantageously, satisfactory quality of the phase-change member 102 may be substantially maintained.

The step S205 may further include the subsequent sub-steps: providing a conductive material (e.g., a metal material) in a combination of the first through-hole and the second through-hole for forming the second electrode 107; and performing a polishing process, e.g., a chemical-mechanical polishing (CMP) process to remove excess material and/or to planarize the top surface of the second electrode 107. The second electrode 107 may be formed of aluminum and/or one or more other suitable conductive materials.

The second electrode 107 may be electrically connected to the phase-change member 102 through the protective layer 103. The second electrode 107 may be positioned (and secured) between at least two portions of the intermediary layer 105, between at least two portions of the etch-stop layer 104, and between at least two portions of the second dielectric layer 106. The intermediary layer 105, the etch-stop layer 104, etc., may enable a substantially secure combination of the elements positioned above the substrate 100. Advantageously, satisfactory structural robustness of the phase-change device may be substantially ensured.

Figure 3:
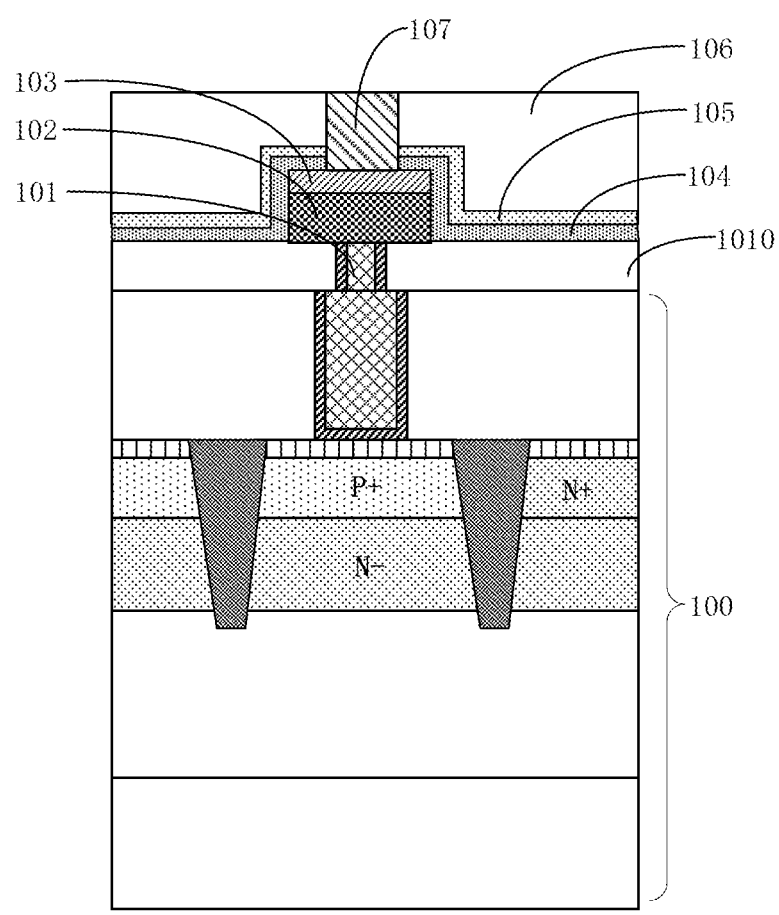
FIG. 3 shows a schematic cross-sectional view that illustrates elements and/or structures of a phase-change device in accordance with one or more embodiments of the present invention.

FIG. 3 shows a schematic cross-sectional view that illustrates elements and/or structures of a phase-change device in accordance with one or more embodiments of the present invention. The phase-change device may have one or more of the features and advantages discussed above with reference to FIG. 1A, FIG. 1B, FIG. 1C, FIG. 1D, FIG. 1E, and FIG. 2.

Referring to FIG. 3, the phase-change device may include the following elements: a substrate 100, which may be an FEOL member; a first dielectric layer 1010, which may be positioned on the substrate 100; a first electrode 101, which may be positioned in the first dielectric layer 1010; a second dielectric layer 106, which may overlap the first dielectric layer 1010; a second electrode 107, wherein a portion of the second electrode 107 may be positioned in the second dielectric layer 106; a phase-change member 102, which may be electrically connected to each of the first electrode 101 and the second electrode 107; an etch-stop layer 104, which may be positioned between the phase-change member 102 and the second dielectric layer 106; and an intermediary layer 105, which may be positioned between the etch-stop layer 104 and the second dielectric layer 106. The second electrode 107 may extend through the intermediary layer 105 and the etch-stop layer 104.

The phase-change device may include a protective layer 103 that may be positioned between the etch-stop layer 104 and the phase-change member 102 and may be positioned between the second electrode 107 and the phase-change member 102. The protective layer 103 may directly contact each of the second electrode 107, the phase-change member 102, and the etch-stop layer 104.

The etch-stop layer 104 may directly contact each of the second electrode 107, the intermediary layer 105, the phase-change member 102, and the protective layer 103. The etch-stop layer 104 may directly contact two opposite sides of the phase-change member 102. The etch-stop layer 104 may directly contact two opposite sides of the protective layer 103. Two top portions of the etch-stop layer 104 may directly contact two opposite sides of the second electrode 107. The two top portions of the etch-stop layer 104 may overlap (and may directly contact) a top side of the phase-change member 102 in a direction perpendicular to a bottom surface of the substrate 100. The two top portions of the etch-stop layer 104 may overlap and directly contact a top side of the protective layer 103 in the direction perpendicular to the bottom surface of the substrate.

A first portion (e.g., a horizontal section) of the etch-stop layer 104 may be positioned between the phase-change member 102 and a first portion (e.g., a horizontal section) of the intermediary layer 105 in the direction perpendicular to the bottom surface of the substrate 100. A second portion (e.g., a vertical section) of the etch-stop layer 104 may be positioned between the phase-change member 102 and a second portion (e.g., a vertical section) of the intermediary layer 105 in a direction parallel to the bottom surface of the substrate 100

The intermediary layer 105 may be formed of a silicon-rich oxide material and may enable substantially secure adhesion between the second dielectric layer 106 and the etch-stop layer 104.

An embodiment of the present invention may be related to an electronic device. The electronic device may include an electronic component and a phase-change device electrically connected to the electronic component. The electronic device may have one or more of the features and advantages discussed above with reference to FIG. 1A, FIG. 1B, FIG. 1C, FIG. 1D, FIG. 1E, FIG. 2, and FIG. 3.

In an embodiment, the electronic device may be or may include a phase-change memory device.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a phase-change device that may have one or more of the features and advantages discussed above.

According to embodiments of the invention, in a process for manufacturing a phase-change device, an etch-stop layer may be provided to protect a phase-change member, and an intermediary layer may be provided to facilitate bonding between elements that overlap the phase-change member. Therefore, satisfactory quality of the phase-change member may be substantially maintained, and satisfactory bonding between elements in the phase-change device may be enabled. Advantageously, satisfactory quality of the phase-change device and a satisfactory yield of the manufacturing process may be substantially ensured.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A phase-change device comprising:
a substrate;
a first dielectric layer positioned on the substrate;
a first electrode positioned in the first dielectric layer;
a second dielectric layer overlapping the first dielectric layer;
a second electrode, wherein a portion of the second electrode is positioned in the second dielectric layer;
a phase-change member electrically connected to each of the first electrode and the second electrode;
an etch-stop layer positioned between the phase-change member and the second dielectric layer; and
an intermediary layer positioned between the etch-stop layer and the second dielectric layer,
wherein the second electrode extends through the intermediary layer and the etch-stop layer, and wherein the second electrode is electrically connected to the phase-change member without directly contacting the phase-change member.

2. The phase-change device of claim 1, wherein the etch-stop layer contacts two opposite sides of the phase-change member.

3. The phase-change device of claim 1, wherein the etch-stop layer contacts each of the second electrode, the intermediary layer, and the phase-change member.

4. The phase-change device of claim 1, wherein a first portion of the etch-stop layer is positioned between the phase-change member and a first portion of the intermediary layer in a direction perpendicular to a bottom surface of the substrate, and wherein a second portion of the etch-stop layer is positioned between the phase-change member and a second portion of the intermediary layer in a direction parallel to a bottom surface of the substrate.

5. The phase-change device of claim 1, wherein the intermediary layer is formed of a silicon oxide material.

6. The phase-change device of claim 1, further comprising a protective layer positioned between the etch-stop layer and the phase-change member and positioned between the second electrode and the phase-change member.

7. The phase-change device of claim 6, wherein the protective layer contacts each of the second electrode, the phase-change member, and the etch-stop layer.

8. An electronic device comprising:
an electronic component; and
a phase-change device electrically connected to the electronic component, wherein the phase-change device comprises:
a first dielectric layer;
a first electrode, which is positioned in the first dielectric layer;
a second dielectric layer, which overlaps the first dielectric layer;
a second electrode, wherein a portion of the second electrode is positioned in the second dielectric layer;
a phase-change member electrically connected to each of the first electrode and the second electrode;
an etch-stop layer positioned between the phase-change member and the second dielectric layer; and
an intermediary layer positioned between the etch-stop layer and the second dielectric layer,
wherein the second electrode extends through the intermediary layer and the etch-stop layer, and wherein the second electrode is electrically connected to the phase-change member without directly contacting the phase-change member.

* * * * *